United States Patent [19]

Sugamori

[11] Patent Number: 4,497,056
[45] Date of Patent: Jan. 29, 1985

[54] IC TESTER

[75] Inventor: Shigeru Sugamori, Gyoda, Japan

[73] Assignee: Takeda Riken Co. Ltd., Tokyo, Japan

[21] Appl. No.: 407,872

[22] Filed: Aug. 13, 1982

[30] Foreign Application Priority Data

Aug. 19, 1981 [JP] Japan .................................. 56-130599

[51] Int. Cl.³ ............................................ G01R 31/28
[52] U.S. Cl. .................................. 371/25; 324/73 R; 371/1; 371/20
[58] Field of Search ............................... 371/1, 20, 25; 324/73 R, 73 AT, 73 PC

[56] References Cited

U.S. PATENT DOCUMENTS

Re. 31,056 10/1982 Chau et al. ........................ 324/73 R
3,728,679  4/1973 McIntosh ................................. 371/1
3,976,940  8/1976 Chau et al. ........................ 324/73 R
4,139,147  2/1979 Franke ..................................... 371/25

Primary Examiner—Charles E. Atkinson
Attorney, Agent, or Firm—Staas & Halsey

[57] ABSTRACT

An IC tester supplies test pattern signal to an IC being tested and compares response signals therefrom with an expected-value pattern signal to determine whether the IC is acceptable or not. During the test, the IC being tested is severed by a separator means from the drivers, for producing the test pattern signals with a timing signal generator set in a condition for generating reference signals. The reference signals and the outputs from the drivers are compared for phase by a phase comparator means. Variable delay means inserted in the paths of the test pattern signal are adjusted by the result of the comparison to suppress skews between the paths of the test pattern signals. Skews in strobe signals, which serve to determine the logic levels of the response signals output from the IC being tested, are also suppressed.

20 Claims, 20 Drawing Figures

| ADDRESS | CONTENTS |
|---|---|
| 1001 | CALIBRATION TIME |
| 1002 | TEMPERATURE |
| 1003 | DELAY $7_1$ |
| | $7_2$ |
| | $7_n$ |
| | DELAY $16_1$ |
| | $16_2$ |
| XXXX | $16_m$ |

IC TESTER

BACKGROUND OF THE INVENTION

The present invention relates to an IC tester for testing an IC by supplying test pattern signals to the IC and comparing response outputs from the IC and expected-value signals, and more particularly to an IC tester capable of correcting relative phase differences between a plurality of test pattern signals or a plurality of strobe signals for logic determination of the response output from the IC being tested.

IC testers of the type described supply a plurality of test pattern signals simultaneously to a plurality of terminal pins of an IC being tested. One IC test determines whether the IC being tested will operate properly or not when relative phases of the test pattern signals are varied. Furthermore, parallel response outputs from the terminal pins of the IC are subjected to logic decision with relative phases shifted to determine whether the IC produces a proper output. When the relative phases of the test pattern signals are excessively shifted due to a temperature change or with time, no proper test can be expected. When relative phases of the strobe signals are shifted, no correct test results can be obtained. Such shifting of the relative phases is caused by differences between travel times for signals transmitted after the test pattern signals have been prepared until they are supplied to the IC being tested. Therefore, variable delay circuits are inserted in the signal paths, and their delay settings are adjusted to equalize the travel times for the signal paths. However, the travel times tend to differ from each other due to a change in ambient temperature and with time. Since the changing portion in the waveform of each test pattern signal is inclined and logic circuits process signals by determining them as being of a high or low logic level above or below a certain threshold value, a change in the output level of pattern signals (a synchronous signal) in one test causes a shifting of relative phases with respect to pattern signals in another test. The positions of terminal pins such as for address and data pins of an IC memory vary from IC to IC, so that pin positions to which test pattern output signals are supplied need to be switched around, a procedure which causes relative phases to be shifted. It is time-consuming and tedious to adjust the variable delay circuits each time an IC of a different type is to be tested.

It has been the customary practice to adjust the variable delay circuits for calibration to eliminate shifting of relative phases between the test pattern signals and between the strobe signals from a desired phase relationship. Calibration to enable an IC tester to perform desired functions has been described by the present inventor in "A 100 MHz Test Station for High Speed LSI Testing", Digest of Papers, 1979 Test Conference, Cherry Hill, N.J., Oct. 23-25, CH 1509-9/79/0000-0369. This paper however does not show how calibration should be carried out.

SUMMARY OF THE INVENTION

It is an object of the present invention to provide an IC tester having means for automatically correcting relative differences between travel times for test pattern signals and strobe signals to go over signal paths during a testing operation.

Another object of the present invention is to provide an IC tester which does not need to correct relative differences between travel times for test pattern and strobe signals over signal paths even when different types of ICs are tested.

While an IC is being tested, a plurality of drivers for supplying test pattern signals to the IC and a plurality of logic decision circuits for determining the logic level of outputs from the IC are severed from the IC by a separator means. With the separator means disconnecting the IC, reference signals are passed through paths for the test pattern signals, and outputs from the drivers and reference signals are compared with each other by a phase comparator means. Delay settings for variable delay circuits inserted in the paths for the test pattern signals are adjusted so that the compared signals are rendered equal in time to one another. The reference signals are supplied to inputs of the logic decision circuits, and delay settings for variable delay circuits inserted in paths for strobe signals are adjusted so that the phases of the reference signals will be equalized with the phases of the strobe signals which are supplied to the logic decision circuits. Thus, the delay settings for the variable delay circuits can be adjusted for proper tests by disconnecting the separator means as desired while the IC is being tested.

The delay times for the variable delay circuits thus adjusted are stored as calibration data in a memory for each kind of IC. When a test program for an IC is executed for testing an IC, the calibration data for that IC are automatically read out of the memory, and the variable delay circuits are set for respective delay times based on such read-out calibration data. By thus utilizing the stored calibration data, it is not necessary to adjust and control the variable delay circuits each time the kinds of ICs to be tested are changed, and hence the period of time required to run tests can be reduced.

With the calibration data being thus stored, it is determined whether the variable delay circuits need to be adjusted or calibrated at the time of testing, and only when calibration is required, are the variable delay circuits adjusted by the stored calibration data. Such a determination is based on a process of ascertaining whether a predetermined interval of time or longer has elapsed from a previous calibration procedure, or whether the difference between a temperature at the present time and a temperature at the time of the previous calibration exceeds a predetermined value, or on both of such processes.

In another embodiment of the invention, after the variable delay circuits for the paths for the test pattern signals have been adjusted, the output from any one of the drivers can be supplied as the reference signal to the logic decision circuits, so that the driver used solely for supplying the reference signal to the logic decision circuits can be dispensed with. Alternatively, after the variable delay circuits for the paths for the strobe signals toward the logic decision circuits have been adjusted, the outputs from the drivers for the test pattern signals are supplied to the logic decision circuits, and the variable delay circuits for the paths for the test pattern signals are adjusted with the logic decision circuits serving as phase comparators and the strobe signals as the reference signals. With this arrangement, the phase comparator means used only for calibration may be omitted.

The above and other objects, features and advantages of the present invention will become more apparent from the following description when taken in conjunc-

BRIEF DESCRIPTION OF THE DRAWINGS

FIGS. 2A to 2E are timing charts showing timing signals having various phases;

DETAILED DESCRIPTION OF THE PREFERRED EMBODIMENTS

Figure 1:
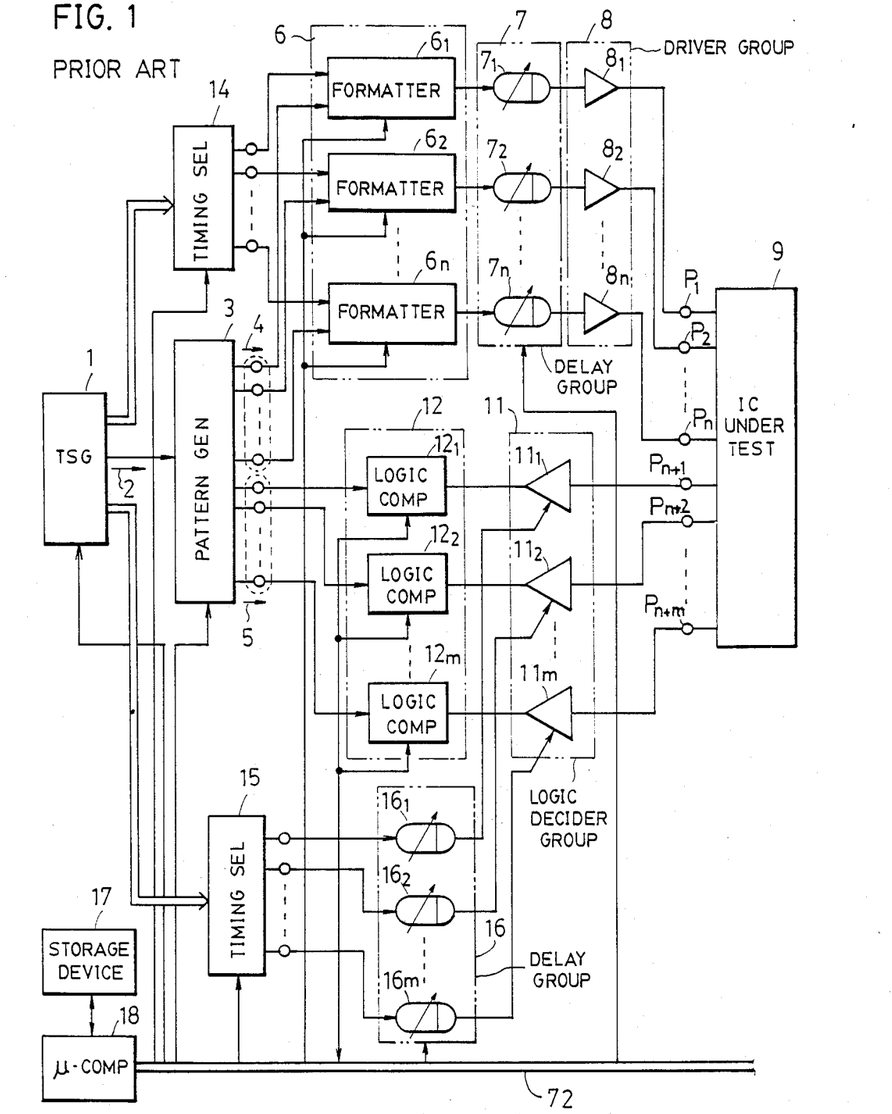
FIG. 1 is a block diagram of a conventional IC tester.
Figures 2A, 2E:
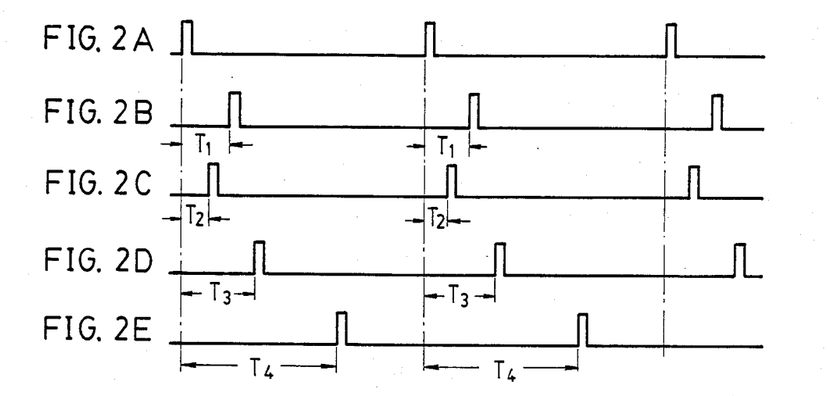

FIG. 1 shows a conventional IC tester having a timing signal generator 1 for supplying a fundamental clock signal (a synchronous signal) 2 to a pattern generator 3, which generates test pattern signals 4 and expected-value signals 5 parallel to each other in response to the fundamental clock signal 2. The test pattern signals 4 are supplied to a group 6 of waveform shaper circuits $6_1$–$6_n$ in which the signals are shaped to predetermined logic waveforms, which are then fed out at desired timings. The test pattern signals of the logic waveforms are delivered through a group 7 of variable delay circuits $7_1$–$7_n$ and a group 8 of drivers $8_1$–$8_n$ to terminal pins $P_1$–$P_n$ of an IC 9 being tested.

Outputs from terminal pins $P_{n+1}$ to $P_{n+m}$ of the IC 9 are supplied to a group 11 of logic decision circuits $11_1$–$11_m$ for determining whether the outputs are of a logic level of H or L. The results from the logic decision circuit group 11 are fed to a logic comparison unit 12 of logic comparison circuits $12_1$–$12_n$. Other input terminals of the logic comparison circuits $12_1$–$12_n$ are supplied with corresponding expected-value signals 5 from the pattern generator 3. Thus the logic comparison circuits $12_1$–$12_n$ compare the signals read out of the IC 9 with the expected-value patterns. When there is any difference between the signals from the IC 9 and the expected-value signals, the IC 9 is determined to be rejected.

The waveform shaper circuits $6_1$–$6_n$ are supplied with timing signals having various timings from the timing signal generator 1 through a timing selector circuit 14. The timing signals serve to determine the timings of the signals to be supplied to the terminals of the IC 9 dependent on the nature of such test signals. The timing of the timing signals are also capable of being changed in order to determine the maximum phase deviations that the test pattern signals to be fed to the IC terminal pins can have from predetermined values for the IC tester to operate properly. The timings are determined dependent on the kind of the IC 9 being tested and the type of the test. The test pattern signals 4 have timings such as shown in FIGS. 2B to 2E which are determined by the timing signals with respect to a reference phase shown in FIG. 2A, and are supplied through the variable delay circuit group 7 to the driver group 8.

Figure 3:
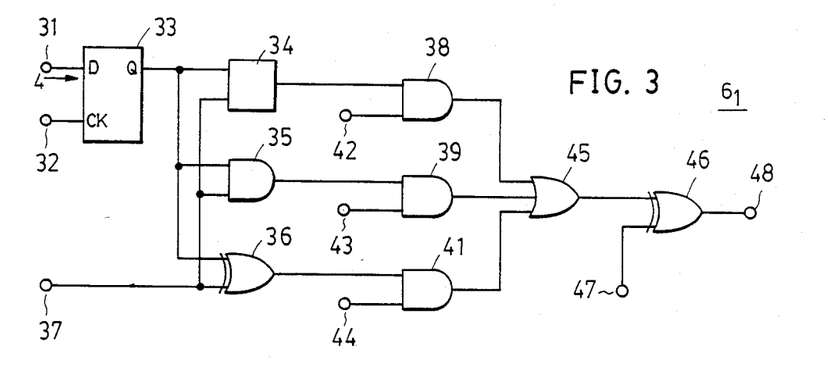
FIG. 3 is a circuit diagram of a logic circuit for a waveform shaper in the IC tester shown in FIG. 1.

FIG. 3 shows one of the waveform shaper circuits $6_1$ as a representative circuit. The waveform shaper circuit $6_1$ has a terminal 31 supplied with a test pattern signal from the test pattern generator 3. The test pattern signal is read into a D-type flip-flop 33 by a timing signal of a fixed phase which is supplied to a terminal 32 from the timing signal generator 1, in synchronism with the pattern signal at terminal 31 via a line not shown in FIG. 1. The flip-flop 33 produces a Q output which is supplied to a component 34, an AND gate 35, and an exclusive OR gate 36. The component 34, the AND gate 35 and the exclusive OR gate 36 are also supplied with timing signals from the timing selector 14 through a terminal 37. As a result, the test pattern signal from the terminal 31 is delivered through the Q output of the flip-flop 33 as an output signal having an NRZ (non-return to zero) waveform from the component 34 at a timing determined by the timing signal from the terminal 37 (the component 34 thus provides the same function as the D-type flip-flop 33 having the two respective inputs 31 and 32), an output signal having an RZ (return to zero) waveform from the AND gate 35 with a phase determined by the timing signal from the terminal 37, and an output signal of a surround complement waveform with a phase determined by the timing signal from the terminal 37. The outputs from the gates component 34 and gates 35, 36 are supplied respectively to AND gates 38, 39, 41 which are controlled by signals on their terminals 42, 43, 44 for passage therethrough of the outputs from the components 34 and gates 35, 36, respectively. Outputs from the gates 38, 39, 41 are fed through an OR gate 45 to an inversion/noninversion selector gate (exclusive OR gate) 46, which produces an inverted or noninverted signal dependent on a control signal applied to a terminal 47 as an output from the waveform shaper circuit $6_1$.

Figure 4:
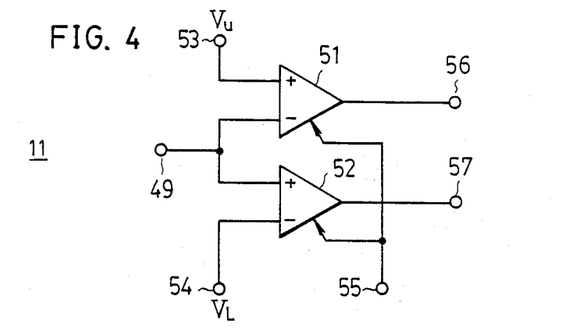
FIG. 4 is a circuit diagram of a logic decision circuit in the IC tester of FIG. 1.

FIG. 4 is illustrative of one of the logic decision circuits $11_1$ as a representative circuit. The logic decision circuit $11_1$ has a terminal 49 to which is supplied an output from the IC 9 being tested. The output is then compared in comparators 51, 52 with a high logic level $V_H$ and a low logic level $V_L$ supplied to terminals 53, 54, respectively. The results of comparison are supplied respectively to output terminals 56, 57 when a strobe signal is applied to a terminal 55. The timing signals from the timing signal generator 1 are selected by a timing selector circuit 15, and supplied through a group 16 of variable delay circuits $16_1$–$16_m$ as strobe signals respectively to the logic decision circuits $11_1$–$11_m$. The strobe signals serve to determine the timings of the logic determinations in the logic decision circuits $11_1$–$11_m$.

Timings $T_1$, $T_2$, $T_3$, $T_4$ as shown in FIGS. 2B to 2E are given by the timing selector circuits 14, 15. The delay times $T_1$–$T_4$ are determined dependent on the type of the IC 9 being tested, the kind of the test, the amplitude of the signal, and the like. These determinating factors are part of a test program stored in a memory device 17 such as a magnetic disc. The test program is read by a microcomputer 18, which delivers settings to the timing selector circuits 14, 15.

The variable delay circuit groups 7, 16 serve to effect fine adjustment of the phases of the test pattern signals supplied to the driver group 8 and of the strobe signals supplied to the logic decision circuits 11. In addition, the variable delay circuit groups 7, 16 enable the test pattern signals to have given phase differences therebetween, such as $T_1$–$T_4$ shown in FIGS. 2B to 2E, and the strobe signals to have given phase differences therebetween. More specifically, the timing selector circuits 14, 15 effect switching between signal paths each time ICs to be tested are changed and test items are changed. The switching between signal paths causes a change in the phase characteristic that each signal path has, thus producing a phase difference (hereinafter referred to as a "skew"). Stated otherwise, in FIG. 1, there are caused changes in delay times for the signals which are supplied from the input terminal of the timing selector circuit 14 to the terminal pins $P_1$–$P_n$ of the IC 9. The variable delay circuit groups 7, 16 are inserted to adjust the phase differences between the signal paths until they fall to zero, or until the skews between the signal paths become zero. With the skews generated between the signal paths being adjusted to zero, the timing selector circuits 14, 15 give timings $T_1$–$T_4$ for allowing the signals to have correct predetermined phases, respectively.

Figure 5:
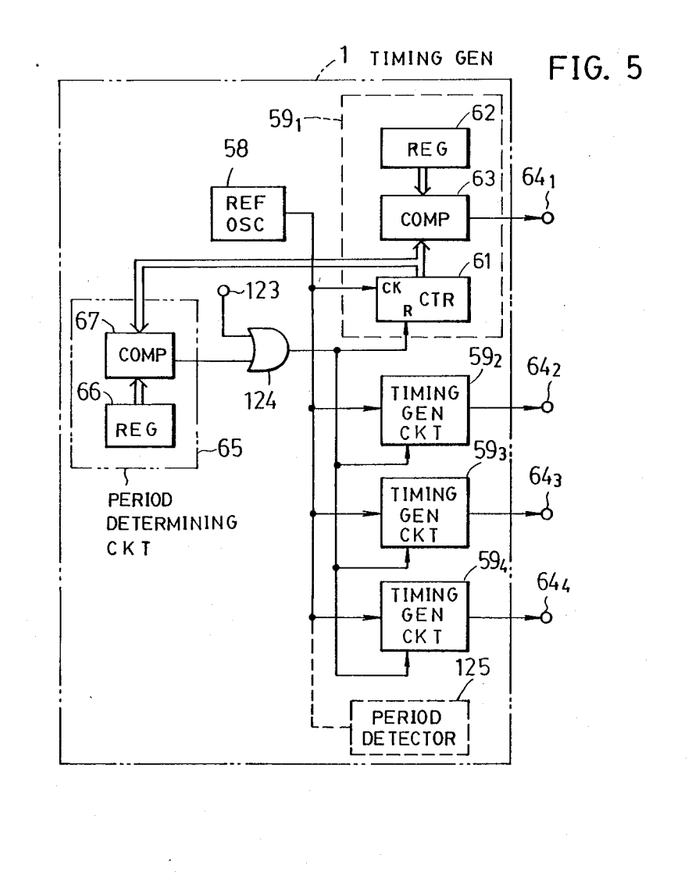
FIG. 5 is a block diagram of a timing signal generator in the IC tester of FIG. 1.

The timing signal generator 1 has a reference oscillator 58, as shown in FIG. 5, for generating highly stable clock signals of 500 MHz which are supplied to timing generator circuits $59_1$–$59_4$. The timing generator circuit $59_1$ includes a counter 61 for counting the input clock signals. The count from the counter 61 is compared in a comparator 63 with a timing setting value preset in a register 62. When the count and the timing setting value agree with each other, the timing generator circuit $59_1$ produces an output timing signal through a terminal $64_1$. The counter 61 is reset by a reset pulse from a period determining circuit 65, which has a comparator 67 for comparing a period setting stored in a register 66 with the count from the counter 61. When the period setting and the count agree with each other, the counter 61 produces the reset pulse. The timing generator circuits $59_2$, $59_3$, $59_4$ are of the same construction as that of the timing generator circuit $59_1$. The registers 62 in the timing generator circuits $59_1$–$59_4$ are controlled by the microcomputer 18 (FIG. 1) to have timing settings, based on which the phases of timing signals are respectively caused to deviate $T_1$, $T_2$, $T_3$ and $T_4$ (FIGS. 2B to 2E) from the fundamental timing signal and are delivered to terminals $64_1$–$64_4$. The register 66 has a period setting which is determined by the microcomputer 18. Thus, the period of the timing signal generated can be set by the microcomputer 18.

Figure 6:
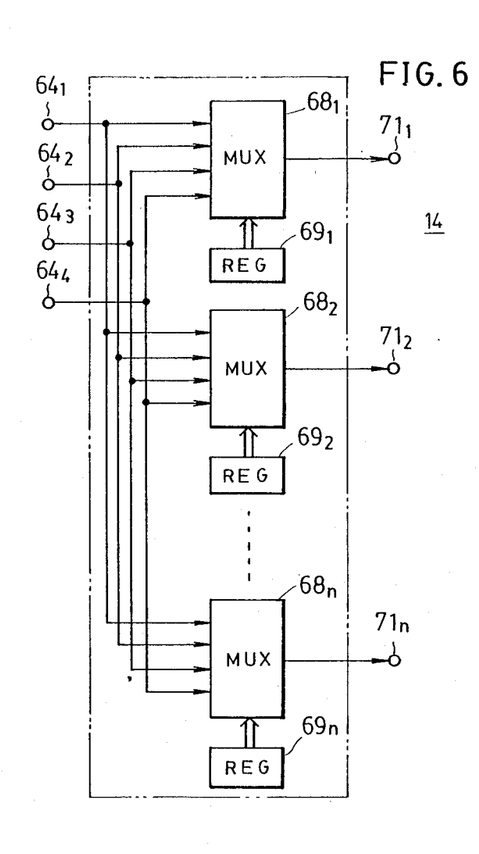
FIG. 6 is a block diagram of a timing selector in the IC tester of FIG. 1.

As shown in FIG. 6, the timing selector circuit 14 has multiplexers $68_1$–$68_n$ which are supplied with timing signals from the timing signal generator 1 through the terminals $64_1$–$64_4$. The multiplexers $68_1$–$68_n$ select one of the four timing signals supplied in response to a selection command set in the registers $69_1$–$69_n$, respectively, and the selected signals are fed to terminals $71_1$–$71_n$, respectively. The timing signals from the terminals $71_1$–$71_n$ are supplied respectively to the waveform shaper circuits $6_1$–$6_n$ shown in FIG. 1. The timing selector circuit 15 in FIG. 1 is of the same construction as that of the timing selector circuit 14.

In FIG. 1, the timing signal generator 1, the timing selector circuits 14, 15, the pattern generator 3, the waveform shaper circuits $6_1$–$6_n$, the logic comparison circuits $12_1$–$12_m$, and the variable delay circuits $7_1$–$7_n$, $16_1$–$16_m$ are connected to the microcomputer 18 through a bus line 72. For execution of the test program, the microcomputer 18 provides settings for the registers shown in FIGS. 5 and 6 to set periods and timings, and selections for timing signals. Likewise, the microcomputer 18 selects output waveforms in the waveform shaper circuits $6_1$–$6_n$ by selectively providing a gate signal to one of the terminals 42, 43 and 44, and sets delays in the variable delay circuits $7_1$–$7_n$, $16_1$–$16_m$. When any of the logic comparator circuits $12_1$–$12_m$ detects a difference between compared signals, such a difference signal is supplied as an interrupt signal to the microcomputer 18, whereupon the test of the IC 9 is finished. Where the IC tester is employed to analyze defects of the IC 9, outputs from the logic comparator circuits $12_1$–$12_m$ and other data are stored in a defect analyzing memory (not shown).

It has been customary practice only to adjust the delay circuits in the variable delay circuits groups 7, 16 at the time of shipment of IC testers so that they will meet typical IC tests. No problem thus arises where the rate of an IC being tested, that is, the relationship among terminal pin positions for address and data, for example, is similar to that of a predetermined IC. However, if such rates differ widely, then test conditions are different to a large extent, and large skews are produced which are not negligible. With a wide variety of types and kinds of ICs available today, the timing selector circuits 14, 15 have a large number of switchable combinations of signal paths, and it has become impossible to reduce the skews generated with correcting settings which are determined in the variable delay circuit groups 7, 16, in advance.

An attempt to adjust the variable delay circuit groups 7, 16 to eliminate the skews each time a test is run would be time-consuming, resulting in a prolonged interval of time required for the test. When there is a temperature change during a test, the delays in the signal paths vary at different rates, causing skews. When the output levels of the drivers $8_1$–$8_n$ are changed for a test, the delay time varies with the output level of the test pattern signal differently in each signal path to thereby produce skews because the signal level is inclined at the transition region between the high and low logic levels of the test pattern signal, namely, at a portion where the waveform changes, and also because the logic circuits have a threshold value. In FIG. 6, the propagation time differs for each of the signals from the terminals $64_1$–$64_4$ to the terminal $71_1$, for example, so that skews will be caused by changeover of the selection of timing signals.

Figure 7A:
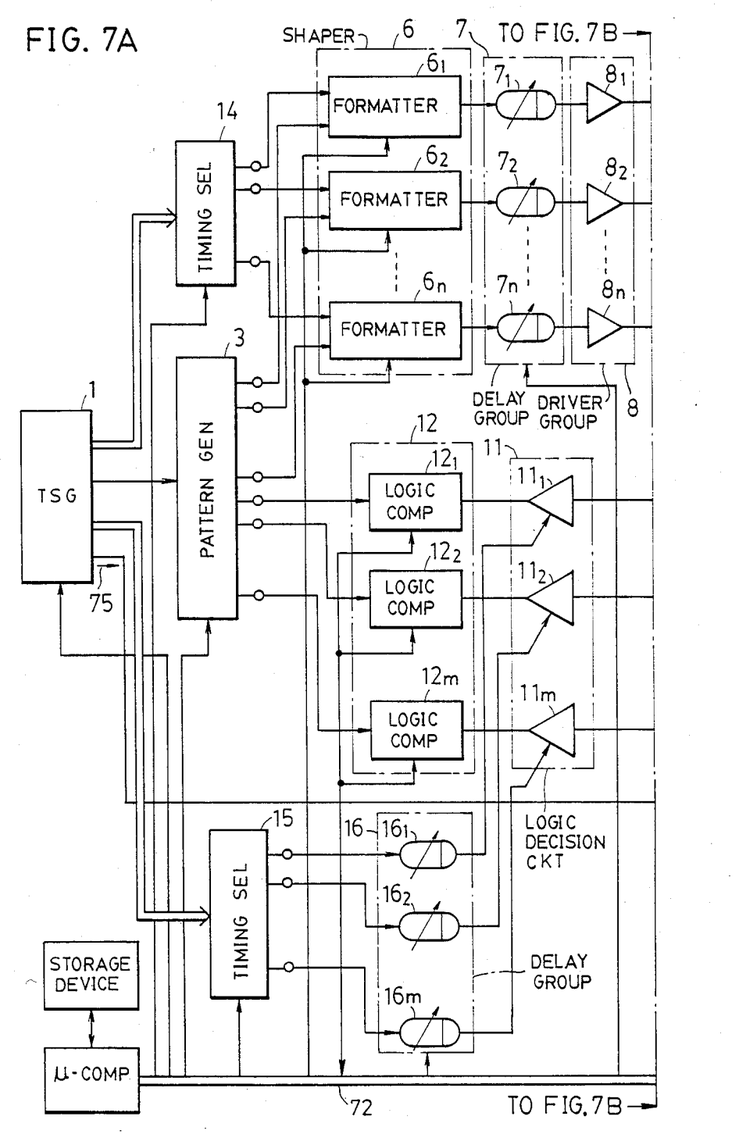
FIGS. 7A and 7B illustrate, in combination, a block diagram of an IC tester according to the present invention.
Figure 7B:
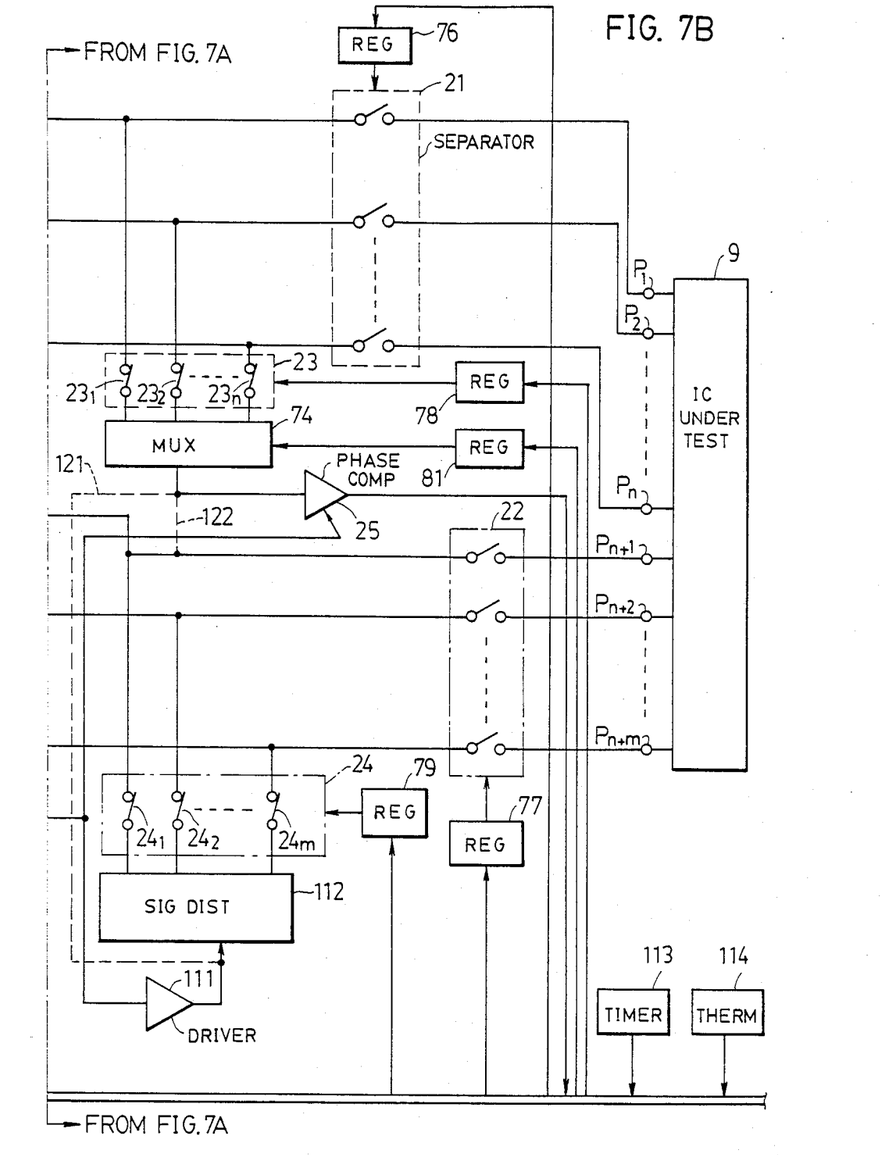

FIGS. 7A and 7B show an IC tester according to an embodiment of the present invention. Hereinafter, the pair of FIGS. 7A and 7B will be referred to simply as FIG. 7. Like or corresponding parts in FIG. 7 are denoted by like or corresponding reference characters in FIG. 1, and hence will not be described to avoid repetition. According to the illustrated embodiment, separator means 21, 22 are inserted between the driver group 8 and the IC 9 being tested, and between the IC 9 being tested and the logic decision circuit group 11 for separating these components from each other. Each of the separator means 21, 22 may be composed of relay contacts, for example. In a calibration mode, the driver group 8 and the logic decision circuit group 11 are severed from the IC 9 by the separator means 21, 22. Upon separation, the delay times in the variable delay circuit groups 7, 16 can be adjusted so that the skews will be eliminated independently of the IC 9.

When the separator means 21, 22 are disconnected, a switch group 23 can selectively connect a phase comparator means 25 to the outputs of the driver group 8, and a switch group 24 can supply reference signals to the inputs of the logic decision circuit group 11. More specifically, the outputs of the drivers $8_1$–$8_n$ are connected to the inputs of a multiplexer 74 through switches $23_1$–$23_n$. The multiplexer 74 serves to select one of its inputs so as to supply the same to the phase comparator means 25, which is supplied with a reference signal 75 having a reference phase from the timing signal generator 1. In the illustrated embodiment, the phase comparator means 25 is of the same construction as that of the logic decision circuit 11 as shown in FIG. 4 and determines whether the output from the multiplexer 74 is of a high or low logic level with the reference signal used as a strobe signal.

During calibration, the microcomputer 18 sets separation commands into registers 76, 77 over the bus line 72, and the registers 76, 77 produce outputs to cause the separator means 21, 22 to be disconnected. The microcomputer 18 also sets ON commands into registers 78, 79 over the bus line 72. The registers 78, 79 produce outputs which turn on the switch groups 23, 24. Furthermore, the microcomputer 18 sets signal path designation data into a register 81 which is responsive to such data to control the multiplexer 74 for selecting one of the outputs from the switches $23_1$–$23_n$ and supplying the same to the phase comparator means 25. It is now assumed that the switch $23_1$ is selected by the multiplexer 74. The phase comparator means 25 compares the output from the driver $8_1$ with the reference signal 75 for their phases. The result of comparison is read over the bus line 72 into the microcomputer 18. Dependent on whether the output from the phase comparator means 25 is of a high logic level or low logic level, the microcomputer 18 controls the delay in the variable delay circuit $7_1$ to bring the strobe reference signal 75 into conformity with the boundary between the high and low logic levels of the output of the driver $8_1$, that is, the changing point in the waveform within the phase comparator means 25. After calibration with respect to the signal path including the driver $8_1$ has been finished in this manner, a command for selecting the output from the switch $23_2$ is set into the register 81 for carrying out the same process of calibration for the signal path containing the driver $8_2$. The other signal paths containing the corresponding drivers are then successively calibrated.

Figure 8:
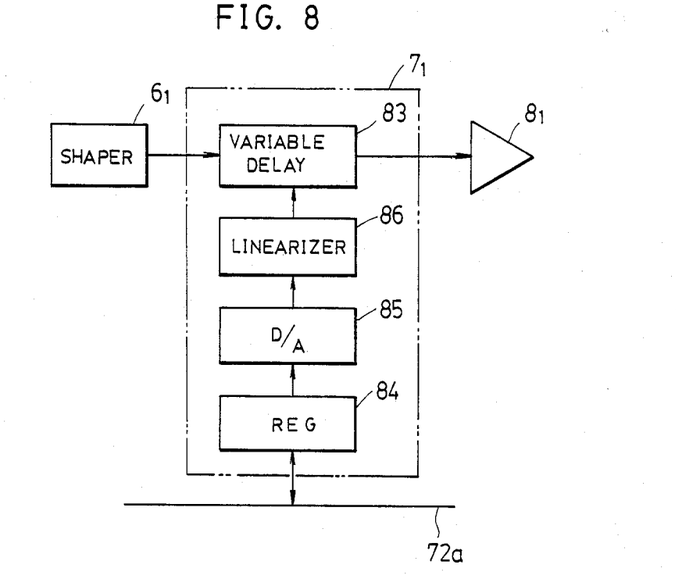
FIG. 8 is a block diagram of a variable delay circuit.

As shown in FIG. 8, the variable delay circuit $7_1$ has a variable delay unit 83 through which the output from the waveform shaper circuit $6_1$ is supplied to the driver $8_1$. The microcomputer 18 sets a delay setting into a register 84 over a data write/read control line 72a in the bus line 72. The delay setting in the register 84 is converted by a D/A converter 85 into an analog signal, which is supplied as a delay control signal to the variable delay unit 83 through a linearizer 86 for controlling the variable delay unit 83 to have a desired delay.

Figure 9:
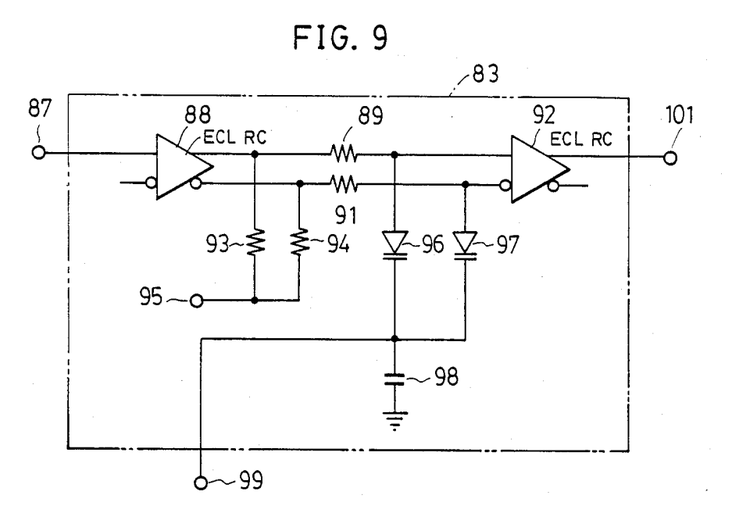
FIG. 9 is a circuit diagram of a variable delay unit in the circuit of FIG. 8.

The variable delay unit 83 has a terminal 87, as shown in FIG. 9, through which the test pattern signal from the waveform shaper circuit $6_1$ is supplied to one input terminal of a differential ECL receiver 88, the other input terminal of which is supplied with a center level VBB. The receiver 88 produces a pair of outputs which are supplied respectively via resistors 89, 91 to a differential ECL receiver 92. The output terminals of the receiver 88 are connected respectively through resistors 93, 94 to a terminal 95 which is kept at a certain negative potential. The receiver 92 has a pair of input terminals which are grounded through variable-capacitance diodes 96, 97 and a common capacitor 98. The connecting point between the diodes 96, 97 and the capacitor 98 is connected with a control terminal 99. The terminal 99 is supplied with a control signal from the linearizer illustrated in FIG. 8 to control the capacitances of the variable-capacitance diodes 96, 97, thereby controlling the delay with which the signals from the receiver 88 reach the receiver 92. The receiver 92 produces an output supplied through a terminal 101 to the driver $8_1$ in FIG. 8.

Figure 10:
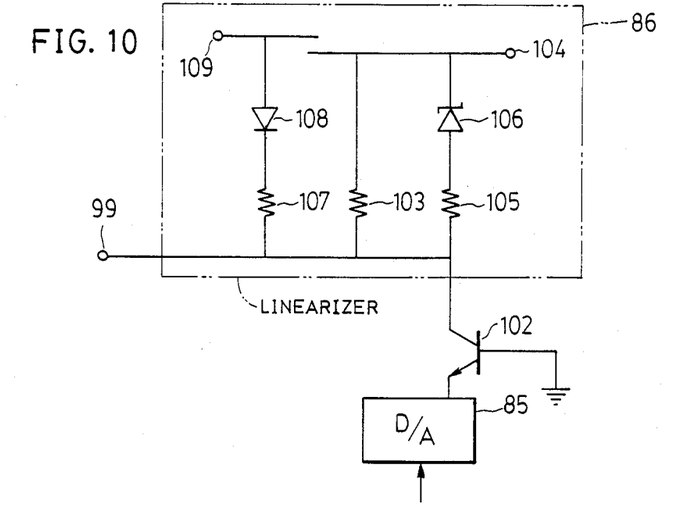
FIG. 10 is a circuit diagram of a linearizer in the circuit shown in FIG. 8.

The linearizer 86 shown in FIG. 8 serves to linearize a non-linear relationship between the control voltage and the capacitances of the variable-capacitance diodes. As illustrated in FIG. 10, an output of the D/A converter 85 is connected to the emitter of a transistor 102 having a base grounded and a collector connected to the control signal terminal 99 and to a terminal 104 through a resistor 103, the terminal 104 being kept at a voltage V1. The collector of the transistor 102 is also coupled through a resistor 107 and a diode 108 to a terminal 109 kept at a voltage V2. The linearizer characteristic for compensating the non-linear relationship between the control voltage and the capacitances of the variable-capacitance diodes is determined by the resistor 103 in a small-capacitance region, by the resistors 103, 107 in a medium-capacitance region, and by the resistors 103, 105, 107 in a large-capacitance region.

The other variable delay circuits $7_2$–$7_n$ and $16_1$–$16_m$ are of the same construction as that of the variable delay circuit $7_1$.

In FIG. 7, the timing signals generated and supplied to timing selector 15 by the timing signal generator 1 are all set to be the same as the reference signal 75, which is fed through a driver 111 to a signal distributer 112. The signal distributor 112 distributes the reference signal to the switches $24_1$–$24_m$ of the switch group 24 from which the reference signal is selectively supplied to the inputs of the logic decision circuits $11_1$–$11_m$. The microcomputer 18 controls the delay times in the variable delay circuits $16_1$–$16_m$ so that the logic of the reference signal can correctly be determined by each of the logic decision circuits $11_1$–$11_m$. The logic comparators $12_1$–$12_m$ produce outputs for determining whether the logic decision has been correctly performed or not. The results of decision are introduced into the microcomputer 18, which controls the delay times in the variable delay circuits $16_1$–$16_m$ based on such results of decision. Such control is effected in each of the variable delay circuits.

Figure 11:
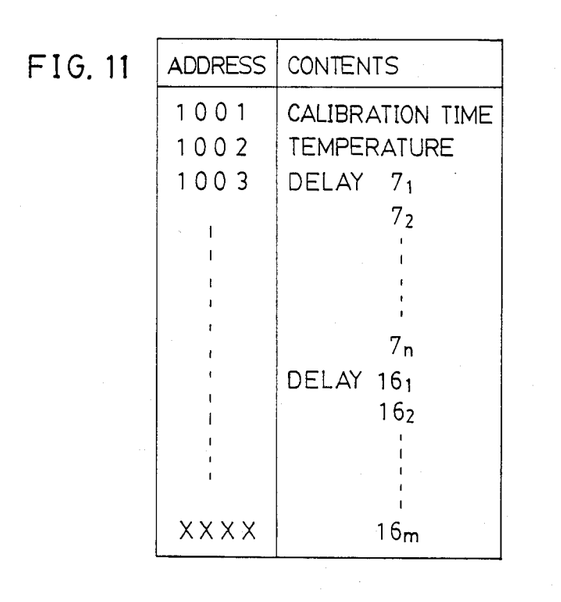
FIG. 11 is a diagram of an arrangement in which calibration data items are stored.

When delay times are determined for the variable delay circuits $7_1$–$7_n$ and $16_1$–$16_m$, data of such delay times are stored in the memory device 17 for use in subsequent tests. The delay time data, namely, calibration data, are stored in storage areas in the memory device 17 which are assigned respectively for the different types of ICs to be tested, as shown in FIG. 11. Such delay time data include the time at which calibration is performed, temperatures during calibration, and delays in the variable delay circuits $7_1$–$7_n$ and $16_1$–$16_m$. For measuring and storing calibration times, a timer 113 is connected to the bus line 72 as shown in FIG. 7. A thermometer unit 114 is also connected to the bus line 72 for measuring the temperature of the IC tester at the time of calibration.

Figure 12:
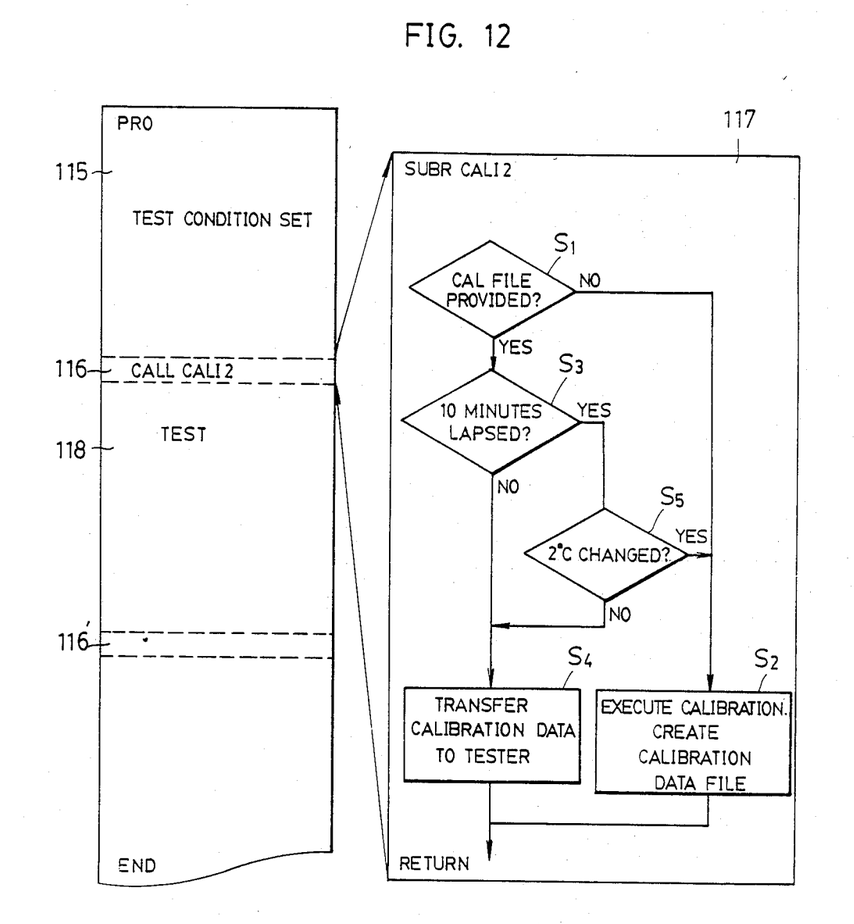
FIG. 12 is a flowchart of a portion of a test program used in the IC tester of the present invention.

According to the present invention, skews are corrected in the process of an IC test. As many programs for testing ICs are prepared as there are different types of ICs to be tested. Each test program contains data on test conditions at a first portion 115 thereof as shown in FIG. 12. Such test condition data include settings of the timing period of the timing signal generator 1 and the timing phase, settings of which phases are given to the timing signals supplied to the waveform shaper circuits $6_1$–$6_n$, settings of the timings for the strobe signal supplied to the logic decision circuits $11_1$–$11_m$, settings of the test patterns in the test pattern generator 3, settings of the output waveforms from the waveform shaper circuits $6_1$–$6_n$, and settings of the output voltages from the drivers $8_1$–$8_n$.

Then, a calibration command 116 is executed to thereby enter a subroutine 117 for calibrating an IC to be tested. In the subroutine 117, at Step $S_1$ it is checked if calibration data for the type of IC to be tested are stored in the memory device 17. If no calibration data are stored, then the program goes to Step $S_2$ to disconnect the separator means 21, 22 (FIG. 7), set the delay times for the delay circuits $7_1$–$7_n$ and $16_1$–$16_m$ so that no skews will be produced, and store the calibration data in the calibration data storage area for the IC to be tested in the memory device 17 as shown in FIG. 11. Thereafter, the program goes back to the main routine for executing a test program 118.

When calibration data are found to be stored in the memory device 17 at Step $S_1$ in the calibration subroutine 117, the program goes to Step $S_3$ to check whether a predetermined time interval such as 10 minutes has elapsed since the calibration data were stored. With a previous calibration time stored as shown in FIG. 11, such a checking operation is performed by ascertaining whether the current time in the timer 113 differs from such a stored time by 10 minutes or longer. When the time difference does exceed 10 minutes, it is determined that there would not be produced skews which cannot be neglected even when previous calibration data are used. Then, the program goes to Step $S_4$ in which calibration data for the IC being tested are taken out of the memory device 17, and delays are set into the variable delay circuits $7_1$–$7_n$ and $16_1$–$16_m$. Subsequently, the program returns to the test running program 118.

When it is found in Step $S_3$ that 10 minutes or longer have elapsed since the previous calibration, the program branches to Step $S_5$ to compare a measured value on the thermometer 114 with a temperature at the time of the previous calibration which is stored in the memory device 17 thereby checking whether the difference is a predetermined value or more, e.g., 2 degrees Celsius or more. If the temperature difference is smaller than 2 degrees Celsius, then it is determined that almost no skews would be generated even with the previous calibration data, and the program goes back to Step $S_4$. If the temperature has varied 2 degrees Celsius or more in Step $S_5$, then the program goes to Step $S_2$ for calibration.

In the case where a lapse of 10 minutes or longer is detected at Step $S_3$, the program may go to Step $S_2$ rather then Step $S_5$. That is, whether calibration should be made or not may be determined on the basis of only elapsed time. Step $S_3$ may be dispensed with, and the program may proceed directly to Step $S_5$ if calibration data have been found to be stored in the memory device 17 at Step $S_1$. In addition, a calibration command 116' shown by the dotted line may be inserted in the test running program 118 thereby to jump to the calibration subroutine 117.

Figure 13:
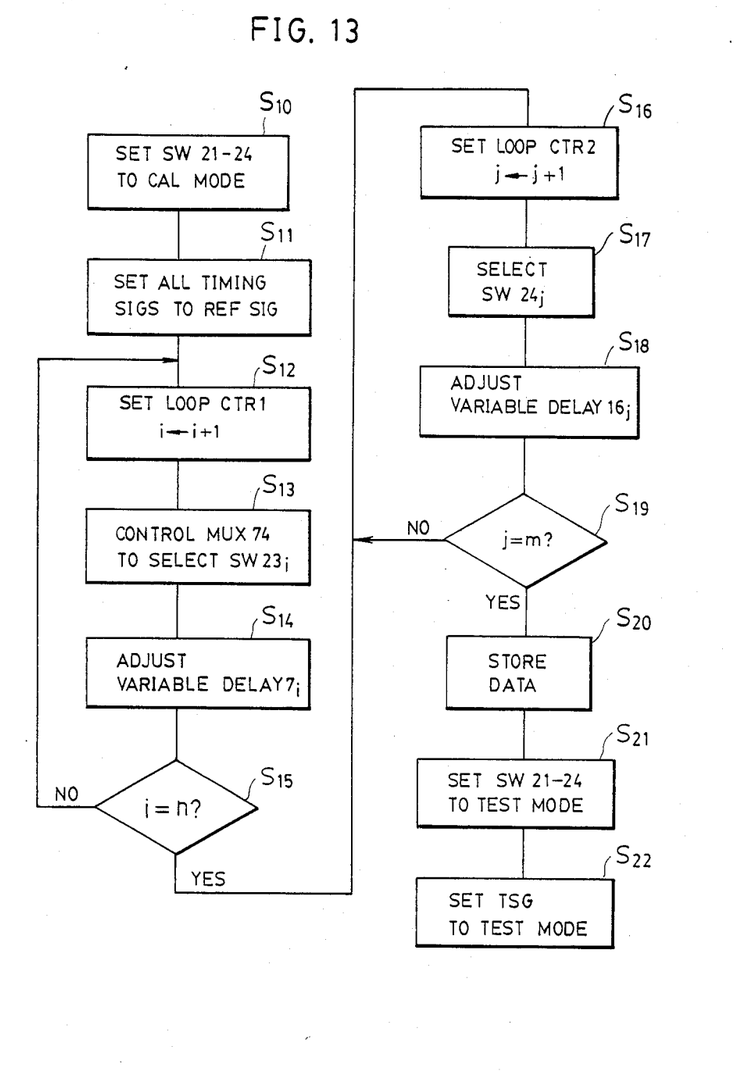
FIG. 13 is a flowchart of operations of a calibration execution step $S_2$ in the test program shown in FIG. 12.

The processing at Step $S_2$ shown in FIG. 12 is carried out according to a flowchart of FIG. 13. In FIG. 13, the separator means 21, 22 and the switch 23 (FIG. 7) are set to the calibration mode at Step $S_{10}$, and all of the outputs from the timing signal generator 1 are selected as reference signals at Step $S_{11}$. In Step $S_{12}$, 1 is added to the content i in a loop counter provided in the microcomputer 18. Since i=0 by an initializing program, the count in the counter becomes i=1. The multiplexer 74 is controlled in Step $S_{13}$ to select the output of the i(=1)th switch $23_1$. In Step $S_{14}$, the i(=1)th variable delay circuit $7_1$ is adjusted to bring the output from the multiplexer 74 into conformity with the strobe reference signal 75 in the phase comparator means 25. In Step $S_{15}$ it is checked if the count i in the loop counter becomes n or not. If i≠n, then the program goes back to Step $S_{12}$ to repeat the same process. After all of the adjustments have been finished for the variable delay circuits $7_1$–$7_n$, it becomes i=n and the program proceeds to Step $S_{16}$ in which 1 is added to a count j in a loop counter to make j=1. The j(=1)th switch $24_1$ is turned on at Step $S_{17}$. In Step $S_{18}$, the j(=1)th variable delay circuit $16_1$ is adjusted to equalize the phases of the inputs to the j(=1)th logic decision circuit $11_1$. In Step $S_{19}$ it is checked if j=m. If j≠m, then the program returns to Step $S_{16}$. After the variable delay circuits $16_1$ to $16_m$ have been adjusted, j reaches m and calibration data such as delays, calibration time, and calibration temperature for the variable delay circuits $7_1$–$7_n$ and $16_1$–$16_m$ are stored at Step $S_{20}$ in a storage area in the memory device 17 which corresponds to the kind of the IC being tested. In Step $S_{21}$, the settings in the registers in the timing signal generator 1 are set to the test mode condition, and in Step $S_{22}$, the separator means 21, 22 and the switch groups 23, 24 are set to the IC test mode condition. During calibration, all of the switches $24_1$–$24_m$ may be turned on to supply the reference signals to the logic decision circuits $11_1$–$11_m$ simultaneously.

In FIG. 7, the output of the multiplexer 74 may be connected to the input of the signal distributor 112 as shown by the broken line 121, and the driver 111 may be dispensed with. With this modification, the variable delay circuits $7_1$–$7_n$ are adjusted at first. Such adjustment causes all of the outputs from the drivers $8_1$–$8_n$ to have a reference phase. Then, one of the drivers $8_1$–$8_n$ is supplied as a reference signal through the multiplexer 74 and the line 121 to the input of the signal distributor 112 for adjusting the variable delay circuits $16_1$–$16_m$. One of the drivers $8_1$–$8_n$, instead of the driver 111, can be utilized during calibration.

The output of the multiplexer 74 may be connected as shown by the broken line 122 to the input of one ($11_1$ in the illustrated embodiment) of the logic decision circuits $11_1$–$11_m$, and the phase comparator means 25 may be omitted. According to this modification, the variable delay circuits $16_1$–$16_n$ are adjusted at first. This adjustment equalizes the phase of each strobe signal given to the logic decision circuits $11_1$–$11_m$ with the phase of the reference signal 75 applied through the driver 111 and the signal distributor 112. Then, the multiplexer 74 is controlled to supply the outputs of the drivers $8_1$–$8_n$ successively to the logic decision circuit $11_1$ over the broken line 122, and each corresponding one of the variable delay circuits $7_1$–$7_n$ is adjusted so that the boundary between the high and low logic levels of the inputs to the logic decision circuit $11_1$ will be synchronized with the strobe signal. Accordingly, one of the logic decision circuits $11_1$–$11_m$ may be utilized instead of the phase comparator means 25 for calibration.

Figure 14:
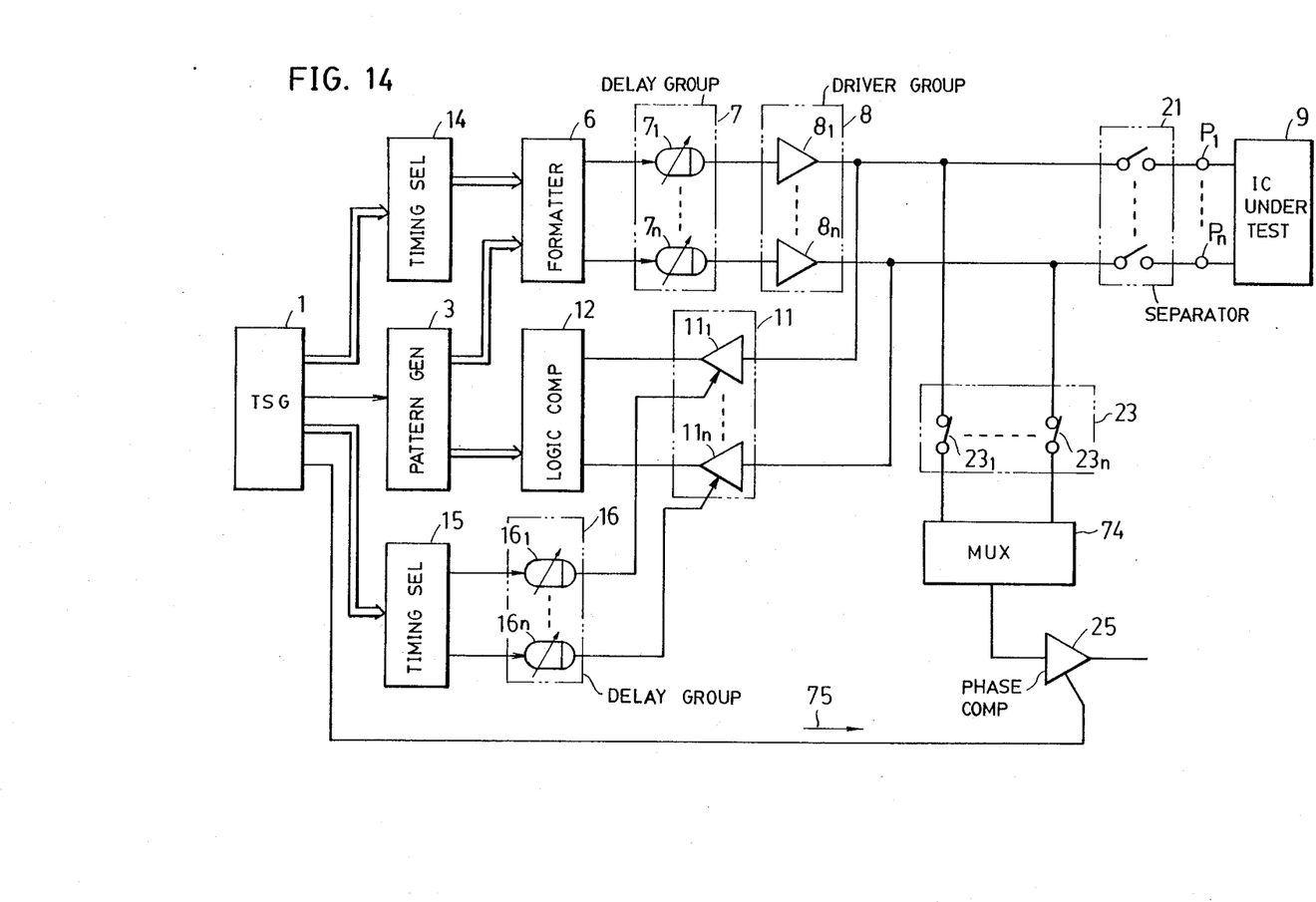
FIG. 14 is a block diagram, partly omitted from illustration, of an IC tester according to another embodiment of the present invention.

Some ICs to be tested have terminal pins which can be used as inputs and outputs on a time-sharing basis. An IC tester for testing such ICs is shown in FIG. 14. Like or corresponding parts in FIG. 14 are designated by like or corresponding reference characters in FIG. 7 although the microcomputer 18, the storage device 17 and the bus 72 are omitted for clarification. The drivers $8_1$–$8_n$ have outputs connected respectively to the inputs of the logic decision circuits $11_1$–$11_n$ and also to input/output terminal pins $P_1$–$P_n$ of an IC 9 to be tested via a separator means 21. Test pattern signals are supplied from the drivers $8_1$–$8_n$ to the input/output terminal pins $P_1$–$P_n$ of the IC 9, and then response outputs therefrom which appear on the terminal pins $P_1$–$P_n$ are logically determined by the logic decision circuits $11_1$–$11_n$. Thereafter, the outputs from the IC 9 are compared with expected-value signals.

With such an IC tester, the separator means 21 is inserted between the drivers $8_1$–$8_n$ and the logic decision circuits $11_1$–$11_n$, and the IC 9 to be tested, and the connecting points between the drivers $8_1$–$8_n$ and the logic decision circuits $11_1$–$11_n$ are connected to the multiplexer 74 through switches $23_1$–$23_n$, respectively. The output from the multiplexer 74 is compared in phase with the reference signal 75 in the phase comparator means 25. For calibration, the IC 9 to be tested is severed by the separator means 21, the switches $23_1$–$23_n$ are turned on, and the multiplexer 74 is controlled to supply the output of one of the drivers $8_1$–$8_n$ to the phase comparator means 25. A corresponding one of the variable delay circuits $7_1$–$7_n$ is adjusted to bring the logic transition point in the waveform into conformity with the reference signal which is the strobe signal of the phase comparator means 25. After all of the variable delay circuits $7_1$–$7_n$ have been adjusted, the switches $23_1$–$23_n$ are turned off, the adjusted reference signals from the drivers $8_1$–$8_n$ are supplied to the logic decision circuits $11_1$–$11_n$, and the variable delay circuits $16_1$–$16_n$ are respectively adjusted to coincide the logic transition point in the reference signal waveforms output from the drivers $8_1$–$8_n$ with the respective strobe signals for the logic decision circuits $11_1$–$11_n$. The foregoing calibration is effected also by a microcomputer (not shown) which is of the same construction as that of the microcomputer 18 shown in FIG. 7.

Figure 15:
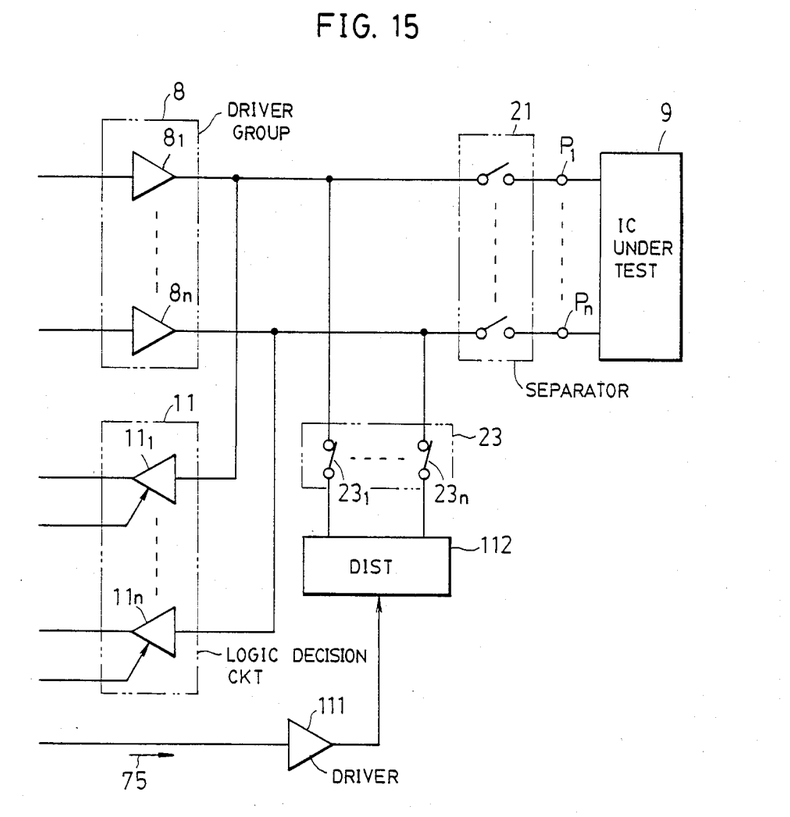
FIG. 15 is a block diagram of a modification of a portion of the IC tester shown in FIG. 14.

FIG. 15 shows a modification of a portion of the tester shown in FIG. 14. A distributor 112, instead of the multiplexer 74, is connected to the switches $23_1$–$23_n$, and a reference signal 75 is supplied through a driver 111 to the input of the distributor 112. With this modification, the reference signal 75 is supplied to the logic decision circuits $11_1$–$11_n$ through the distributor 112 and the switches $23_1$–$23_n$ for calibration. The variable delay circuits $16_1$–$16_n$ are adjusted to coincide the logic changing point in the waveform of each input signal of the logic decision circuits $11_1$–$11_n$ with the corresponding strobe signal. Subsequently, the switch 23 is turned off, the outputs of the drivers $8_1$–$8_n$ are supplied to the logic decision circuits $11_1$–$11_n$, and the variable delay circuits $7_1$–$7_n$ are adjusted to bring the logic changing point in the waveform into conformity with each respective strobe signal.

The temperature measurement at Step $S_5$ in the calibration subroutine 117 in FIG. 12 is effected using the thermometer 114 shown in FIG. 7. However, a temperature shift may be detected as a shift in an oscillation frequency of an oscillator circuit containing a portion of the test pattern signal path or the strobe signal path. For example, the output of the multiplexer 74 in FIG. 7 is supplied to a terminal 123 (see FIG. 5) in the timing signal generator 1, and such supplied output and the output from the period determining circuit 65 are ORed by a circuit 124. The counter 61 is reset by the signal from the terminal 123. At this time, zero is set in the register 62. When the counter 61 is reset, a timing signal is immediately produced from the terminal $64_1$, and is supplied to the multiplexer 74 through the test pattern signal path including the timing selector 14, the waveform shaper circuit group 6, the variable delay circuit group 7 and the driver group 8. The multiplexer 74 produces an output which is fed back to the timing signal generator 1, from which a timing signal is generated again, thereby causing oscillation. The period of such oscillation is measured by a period detector 125 (FIG. 5) from which the measured value can be taken into the microcomputer 18. At the time of calibration, when zero is set in the register 62 and an initial pulse is supplied to the terminal 123, the foregoing oscillation is produced. The period of oscillation varies when the ambient temperature changes as the travel time in the test pattern signal path changes. When such a variation exceeds a predetermined value, it is determined that calibration needs to be effected.

With the arrangement of the present invention, when a test program is executed, delay times for the variable delay circuit groups 7, 16 are automatically adjusted until skews are eliminated. The IC tester of the present invention is highly advantageous in that it requires no manual calibration for the kinds of ICs and types of tests.

Although certain preferred embodiments have been shown and described, it should be understood that many changes and modifications may be made therein without departing from the scope of the appended claims.

What is claimed is:
1. An IC tester comprising
test pattern signal generating means for supplying test pattern signals with predetermined timings from each of the outputs of a plurality of N parallel channels to an IC to be tested, each of said N channels including a respective first delay element having a respective variable delay time for delaying the respective test pattern signals being provided from the respective one of the N channels,
response signal comparing means for comparing at further predetermined timings, in conjunction with said supplying of test pattern signals by said test pattern signal generating means, the logic levels of respective response signals that are input from the IC to a plurality of M parallel channels, with respective expected values for the response signals, and said response signal comparing means including for each of said M channels a respective second delay element in a respective time signal line, each said second delay element having a respective variable delay time for delaying the timing for deter- mining the respective comparing of the response signals with the expected values, and calibration means, operatively connected to said test pattern signal generating means and to said response signal comparing means, for automatically determining on predetermined conditions, relative travel times for signals on said N parallel channels and relative timing for said comparing of signals on said M channels, for setting the respective delay times of said first and second delay elements to suppress skews between said N channels to enable said supplying of said test pattern signals at the respective outputs of said N channels with the respective predetermined timings, and to suppress skews in the time signal lines so as to enable said comparing of response signals with the respective predetermined timings.

2. The tester of claim 1, wherein at least one of said test pattern signal generating means and said response signal comparing means includes means for providing said expected values and for providing first and second pluralities of timing signals, said predetermined timings of said test pattern signals from said N channels correspond to said first plurality of timing signals as a result of the delay times of the first delay elements, and said predetermined timings for said comparing of response signals correspond to said second plurality of timing signals as a result of the delay times of the second delay elements, and N is greater than the number of said first plurality of timing signals and M is greater than the number of said second plurality of timing signals.

3. The device of claim 1, comprising each of said N channels including a respective waveform shaping circuit connected in series with teh respective first delay element, each of said M channels including a respective logic decision circuit having a respective response signal provided as an input thereto, for determining the logic level of the respective response signal, and a respective logic comparator circuit connected to compare the outputs of the respective logic decision circuit with respective expected values, wherein the second delay elements along said time signal lines respectively provide strobe signals to the logic decision circuits to respectively control the timings of the determining of the logic levels of the response signals, said test pattern signal generating means and said response signal comparing means commonly comprising a pattern data generator and a timing signal generator, said pattern data generator having a respective output to each said waveform shaping circuit and logic comparator circuit, for providing respective pattern data to each said waveform shaping circuit and said expected values of said response signals to said logic comparison circuits, and said timing signal generator having first and second pluralities of output terminals for outputting timing signals corresponding to said predetermined timings for said supplying of test pattern signals and comparing of response signals, said test pattern signal generating means including a first timing selector having a respective plurality of input terminals connected to said first plurality of output terminals of the timing signal generator, and N output terminals for selectively providing said timing signals from said first plurality of output terminals as respective inputs to the waveform shaping circuits of said N channels, and said response signal comparing means including a second timing selector having a respective plurality of input terminals connected to said second plurality of output terminals of the timing signal generator, and M output terminals for selectively providing said timing signals from said first plurality of output terminals as respective inputs to said second delay elements of said M channels, for providing said strobe signals to said logic decision circuits, wherein said timing signal generator, pattern generator, waveform shaping circuits operate in synchronism for said supplying of test pattern signals and said comparing of response signals.

4. The tester of claim 3, wherein at least one selected one of said test pattern signals is provided on each of said N channels, and said timing signal generator generates a reference signal, said calibration means includes phase comparator means for comparing the phase of said reference signal with the respective output of each of said N channels corresponding to said at least one selected test pattern signal, and the respective outputs of the phase comparator corresponding to said phase comparing are used to determine each said delay time of the N first delay elements.

5. The tester of claim 3, wherein at least one selected one of said test pattern signals is provided on each of said N channels, and said timing signal generator generates a reference signal, said calibration means includes means for supplying the outputs of said N channels, on which said at least one selected test pattern signal is provided, as the input to a selected one of said logic decision circuits, while said reference signal is supplied via the respective output terminal of said second timing selector means and the respective second delay element as the strobe signal to the selected logic decision circuit, the delay time of each of said first delay elements is determined based on a respective coincidence in timing between each said input to the selected logic comparator circuit, corresponding to said at least one selected test pattern signal being output from said N channels, and said reference signal is supplied as the respective strobe signal.

6. The tester of claim 3, wherein said timing signal generator provides a reference phase signal, via output terminals of said second timing selector and said second delay elements as the respective strobe signals to each said logic decision circuit, and generates a reference signal, said calibration means including reference supply means for providing said reference signal as the inputs to said logic decision circuits, and the delay time of each said second delay element is determined based on a respective coincidence in timing between said reference phase signal supplied as the strobe input to the respective logic decision circuit and the reference signal supplied as the input of the same respective logic decision circuit.

7. The tester of claim 6, wherein a selected one of said test pattern signals having timing corresponding to said reference signal is provided at the output of a selected one of said N channels, and said reference supply means includes means for providing the output of said selected one of the N channels as said input to each said logic decision circuit for said determining of the delay time of each said second delay element.

8. The tester of claim 3, 4, 5, 6 or 7, said calibration means including separator means for disconnecting said IC from at least predetermined ones of said M and N channels during said determining of the delay times of at least the respective variable delay elements.

9. The tester of claim 3, 4, 5, 6 or 7, comprising N drivers respectively connected to the outputs of said waveform shaping circuits in said N channels.

10. The tester of claim 4, 5, 6 or 7, wherein M=N, the output of each said channel for providing said test signals to the IC is connected to the input of a respective one of said channels for said response signals, and said test pattern signals are supplied to said IC, and said response signals from said IC are compared with said expected values, on a time-sharing basis.

11. The IC tester of claim 4, 5, 6 or 7, comprising calibration data storage means for storing as calibration data said delay times for said first and second delay elements as determined by said calibration means for a plurality of types of said IC to be tested, and means for selectively reading the respective calibration data for a particular type of said IC to be tested out of said calibration data storage means at the beginning of testing, to thereby provide the respective delay times for said first and second delay elements.

12. The tester of claim 11, said calibration means comprising effectiveness decision means for determining whether the respective calibration data are effective prior to said delay times for said first and second delay elements, and means for effecting the calibration control for determining said delay times when said calibration data are determined to be ineffective.

13. The tester of claim 12, wherein said effectiveness decision means comprises means for forming an oscillator circuit of a closed loop which includes at least a portion of at least one of said N channels for supplying said test pattern signals to the IC being tested and a portion of at least one of said M channels for comparing the response signal from the IC with the respective expected values, means for measuring the period of oscillation of said oscillator circuit, and means for determining said calibration data as being effective when the difference between the measured oscillation period and a previously measured value is smaller than a predetermined value and as being ineffective when said difference is larger than said predetermined value.

14. The tester of claim 12, wherein said effectiveness decision means comprises means for measuring the temperature of the IC tester, and means for determining the stored calibration data as being effective when the difference between the measured temperature and a previously measured temperature is smaller than a predetermined value and as being ineffective when said difference is larger than said predetermined value.

15. The tester of claim 12, wherein said effectiveness decision means comprises means for measuring a time which has elapsed from a previous calibration, and means for determining that the stored calibration data is effective when the elapsed time is smaller than a predetermined value and as being ineffective when said elapsed time is larger than said predetermined value.

16. The tester of claim 15, wherein said effectiveness decision means further comprises means for measuring the temperature of the IC tester, and means for detecting the difference between said measured temperature and a previously measured temperature corresponding to the stored calibration data, wherein, when said elapsed time is larger than said predetermined value, said calibration data are determined as being effective when said difference in temperature is smaller than a further predetermined value and as being ineffective when said difference is larger than said further predetermined value.

17. The tester of claim 4, said calibration means comprising a multiplexer inserted between said phase comparator and the outputs of said N channels.

18. The tester of claim 17, said calibration means comprising a group of switches inserted between said multiplexer and the outputs of said N channels, separator means for disconnecting said IC from at least said channels, wherein each said switch is capable of being turned on when said separator means disconnects said IC from said N channels.

19. The tester of claim 6, comprising said reference supply means comprising a group of switches respectively connected to the inputs of said logic decision circuits for selectively supplying said reference signal thereto, said calibration means including separator means for disconnecting said IC from said M channels, and said switches being capable of being turned on when the IC being tested is disconnected from said separator means.

20. The tester of claim 19, including a distributor inserted between said group of switches and said reference supply means, for distributing said reference signal to said switches.

* * * * *